United States Patent
Lever

(10) Patent No.: US 7,492,196 B2
(45) Date of Patent: Feb. 17, 2009

(54) LOW INJECTION CHARGE PUMP

(75) Inventor: Andrew M. Lever, Surrey (GB)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 11/085,563

(22) Filed: Mar. 22, 2005

(65) Prior Publication Data

US 2005/0162203 A1    Jul. 28, 2005

Related U.S. Application Data

(62) Division of application No. 09/819,626, filed on Mar. 29, 2001, now Pat. No. 6,891,411.

(51) Int. Cl.
*H03L 7/06* (2006.01)
(52) U.S. Cl. ............................ 327/157; 327/382
(58) Field of Classification Search ............... 327/148, 327/147, 156–158, 382; 375/374, 373, 375, 375/376; 331/17, 25
See application file for complete search history.

(56) References Cited

U.S. PATENT DOCUMENTS

| 5,532,636 A | 7/1996 | Mar et al. ............... 327/543 |
| 5,592,113 A | 1/1997 | Quiet et al. ............. 327/158 |
| 5,734,279 A | 3/1998 | Bereza .................... 327/112 |
| 5,781,487 A * | 7/1998 | Jang ........................ 365/204 |
| 5,825,640 A | 10/1998 | Quigley et al. ............ 363/60 |
| 6,052,015 A | 4/2000 | Desbonnets .............. 327/382 |
| 6,124,741 A | 9/2000 | Arcus ...................... 327/112 |
| 6,160,432 A | 12/2000 | Rhee et al. .............. 327/157 |
| 6,222,402 B1 | 4/2001 | Boerstler et al. ........ 327/157 |
| 6,316,977 B1 | 11/2001 | Sargeant .................. 301/157 |
| 6,320,470 B1 | 11/2001 | Arai et al. ................ 331/17 |
| 6,441,660 B1 * | 8/2002 | Ingino, Jr. ................ 327/156 |

FOREIGN PATENT DOCUMENTS

| EP | 0 798 862 A1 | 10/1997 |
| EP | 1 229 656 A2 | 8/2002 |

OTHER PUBLICATIONS

"A Wide-Bandwidth Low-Voltage PLL for PowerPC™ Microprocessors," J. Alvarez, IEEE Journal of Solid-State Circuits, vol. 30, No. 4, pp. 383-391, Apr. 1995.

* cited by examiner

*Primary Examiner*—Lincoln Donovan
*Assistant Examiner*—William Hernandez
(74) *Attorney, Agent, or Firm*—Dickstein Shapiro LLP

(57) ABSTRACT

A fast acting charge pump is provided which is suitable for use in a locked loop circuit where very short duration first and second adjustment pulses are produced by a phase detector. The first complement of the second adjustment pulses are used to switch the output of the charge pump through respective pairs of switching and associated biasing transistors, while a complement of the first and second adjustment pulses are respectively capacitively coupled to interconnection nodes of the pairs of switching and biasing transistors.

12 Claims, 4 Drawing Sheets

LOW INJECTION CHARGE PUMP

This application is a divisional of Application No. 09/819,626, filed Mar. 29, 2001 now U.S. Pat. No. 6,891,411, the entire disclosure of which is incorporated herein.

The present invention relates to charge pumps which have particular utility in phase lock loop (PLL) and delay lock loop (DLL) circuits.

DISCUSSION OF THE RELATED ART

Phase lock loop and delay lock loop circuits are widely used for frequency multiplication and to produce precise delay signals from an incoming clock signal. When such circuits are used in high speed environments such as serial communications, they often need very low phase offset between input and output signals. One common PLL architecture is shown in FIG. 1 and is described in greater detail in the article "A Wide-Bandwidth Low-Voltage PLL for Power PC™ Microprocessors" by Alvarez et al., *Journal of Solid-State Circuits*, Vol. 30, No. 4 April 1995. The entire contents of this article are incorporated herein by reference. The PLL of FIG. 1 relies on a charge pump 11 which receives UP 15 and DOWN 17 pulse signals from a phase detector 13 with the output of the charge pump 11 feeding a PLL loop integrating filter 19. The filter 19 drives a voltage controlled oscillator 20 and the output of oscillator 20 is frequency divided by programmable divider 22. The output of frequency divider 22 drives a delay equalization circuit 24 and different taps of the delay equalization circuit are provided to respective clock regenerator circuits 26, one of which is fed to a programmable divider which in turn feeds one of the inputs of phase detector 13. A system clock SYSCLK signal is applied to the other input of phase detector 13 through a programmable delay match circuit 30. With this circuit, the regenerated clock signals RCLK are frequency and phase locked to the SYSCLK signal. Further details of the operation of the FIG. 1 circuit can be found in the noted Alvarez et al. article.

One problem with charge pump 11 is that with real world transistor devices and process spreads, when the PLL is in lock, neither the UP 15 nor the DOWN 17 pulses occur. This causes a dead-band in the PLL response where differences in phase between an applied system clock signal SYCLK and a PLL generated clock signal CPU cannot be detected. The usual remedy for such a situation is to make sure the UP 15 and DOWN 17 pulses occur under all conditions of operation, that is the duration of the up and down pulses may be limited to very short durations, but they never disappear completely. However, there is a problem in producing a very short pulse at the output of charge pump 11, as it requires a very fast turn on and turn off of the charge pump 11 without a large amount of charge coupling which might distort the output signal.

FIG. 2 illustrates one possible CMOS implementation of a fast switching charge pump 21 which produces a fast current spike at its output 23. Current sources 25 and 27 are switched by respectively serially connected p-channel and n-channel transistors 29, 31 in response to respective $\overline{DOWN}$ (the inverse of a DOWN pulse) and UP pulses applied to respective gates 33 and 35.

The operation of the FIG. 2 circuit is represented by the waveform produced by the FIG. 2 circuit in response to a UP input pulse, which is shown in FIG. 5. As seen, the output current upon the turn-off of transistor 31 goes positive in the shaded region of the output signal before returning to a steady zero state. This output current overshoot is caused by the considerable capacitive charge coupling 41 which occurs between the gate and output of transistor 31. A similar situation exists when transistor 29 is switched by the $\overline{DOWN}$ pulse due to capacitive charge coupling 43 between the gate and output of transistor 29. Any mismatch in the charge coupling at transistors 29 and 31 causes current pulse distortion which is applied to the VCO. The unbalanced charge coupling is compensated by a phase offset at the input to the phase detector 13. Thus, the loop must adjust the UP/DOWN pulse lengths to ensure the net charge flow is zero. It would be desirable to minimize this current pulse distortion.

FIG. 3 illustrates a CMOS charge pump 41 which does not suffer from capacitive charge coupling due to the presence of p-channel and n-channel biasing transistors 43, 45. The transistors 43, 45 are DC biased so that they pass the correct amount of current during switching operations of transistors 29 and 31. Although the FIG. 3 arrangement significantly mitigates the problem of current pulse distortion inherent in the FIG. 2 circuit, operation of the FIG. 3 circuit is relatively slow, as shown in FIG. 6, which illustrates in cross-hatching a trailing edge of the output pulse current produced in response to an UP pulse at the gate of transistor 31. The illustrated slowness in transistor turn-off is attributed to a parasitic load capacitor 57 which exits across the UP source and drain of the UP switching transistor 31. A similar parasitic load capacitor 53 is present across the source and drain of transistor 29. The parasitic load capacitors 51 and 53 produce slow turn off of transistors 29 and 31 and a delay in the trailing edge of the output signal, which is again applied as a phase offset at the input to the phase camparator.

What is needed is a charge pump for use in a PLL and DLL which is fast and which mitigates problems with current overshoot and transistor turn-off slowness.

SUMMARY OF THE INVENTION

The present invention provides a charge pump which has a fast switching characteristic and which mitigates the effected noise, current overshoot and transistor turn-off slowness at the charge pump output. The invention also provides a PLL or DLL circuit which uses the charge pump.

The charge pump incorporates n-channel and p-channel switching transistors and n-channel and p-channel biasing transistors, as well as a capacitive coupling of complementary versions of the signals used to switch the n-channel and p-channel switching transistors to respective nodes which interconnect the p-channel switching and biasing transistors and the n-channel switching and biasing transistors. The capacitively coupled complementary signals cause the charge pump to maintain a fast switching response without output waveform distortion.

These and other features and advantages of the invention will be more clearly understood from the following detailed description of the invention which is provided in connection with the accompanying drawings.

DETAILED DESCRIPTION OF THE PREFERRED EMBODIMENTS

Figure 3:
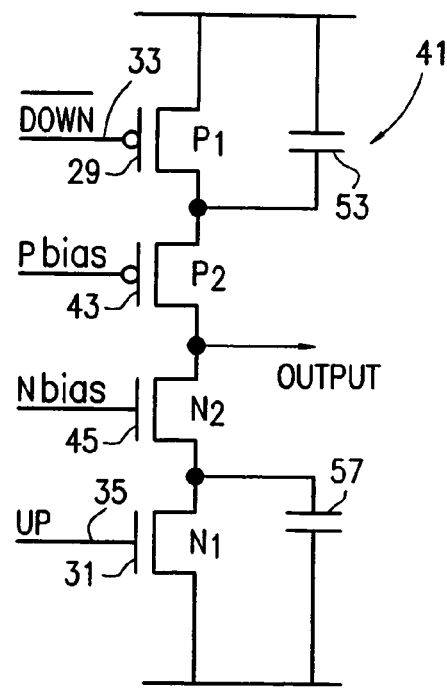
FIG. 3 illustrates a charge pump circuit which is an improvement upon that illustrated in FIG. 2.
Figure 4:
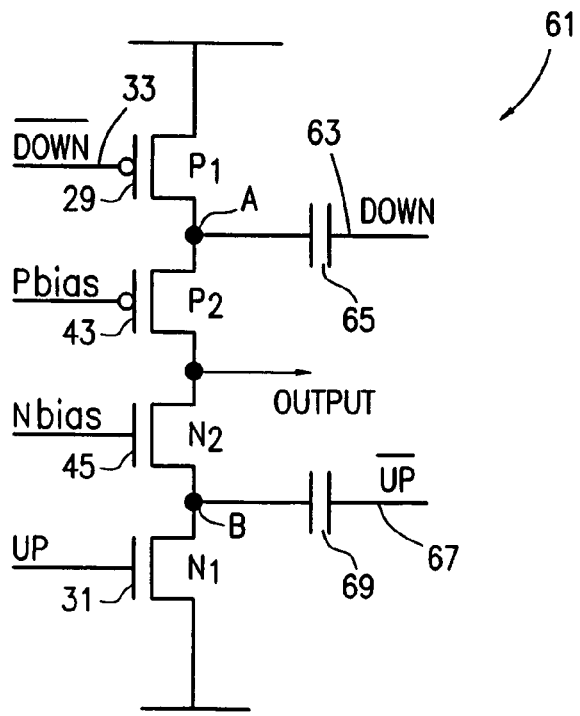
FIG. 4 illustrates a charge pump circuit in accordance with an embodiment of the invention.
Figure 5:
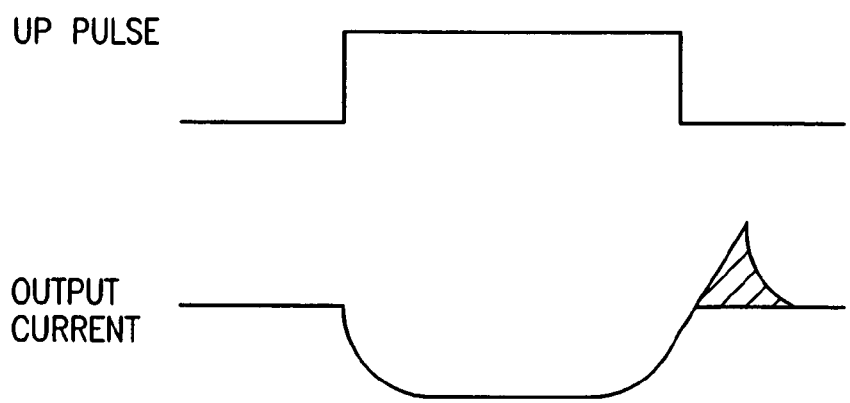
FIG. 5 illustrates a timing diagram which shows operation of the charge pump illustrated in FIG. 2.
Figure 6:
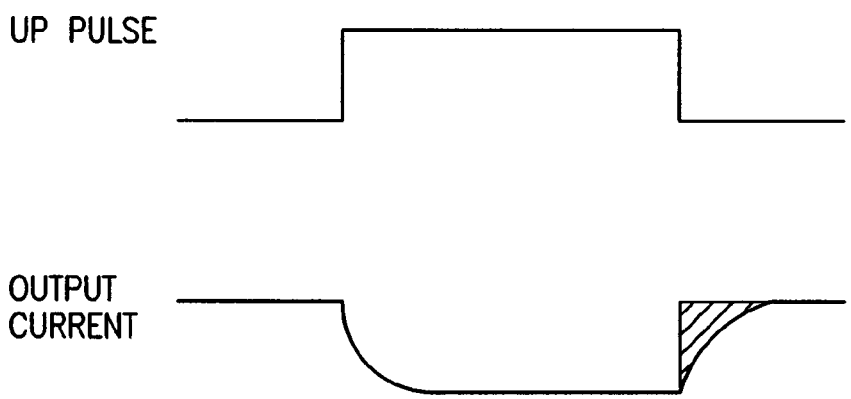
FIG. 6 illustrates a timing diagram of the operation of the charge pump depicted in FIG. 3.

FIG. 4 illustrates an exemplary embodiment of a CMOS charge pump 61 in accordance with the invention. The circuit is essentially the same as that illustrated in FIG. 3, except for the addition of coupling capacitors 65 and 69 which respectively receive an inverted form of the $\overline{DOWN}$ signal applied to gate 33, that is a DOWN signal, and capacitor 69 which receives an inverted form of the UP signal, that is an $\overline{UP}$ signal.

The signal DOWN is applied through capacitor 65 to the common node A of respective switching and DC biasing transistors 29 and 43, while the switching signal $\overline{UP}$ is applied through capacitor 69 to the common node B between respective transistors 45 and 31. The provision of the signals DOWN and UP to respective nodes A and B provides a fast turn on and turn off of the transistors 29 and 31 without waveform distortion in the resulting output signal. The voltage on the capacitors 65 and 69 settles to a DC point where the voltage across transistors 29 and 31 is minimal, but the net effect is a fast turn on and turn off of transistors 29 and 31 with low capacitively coupled charge injection.

Figure 7:
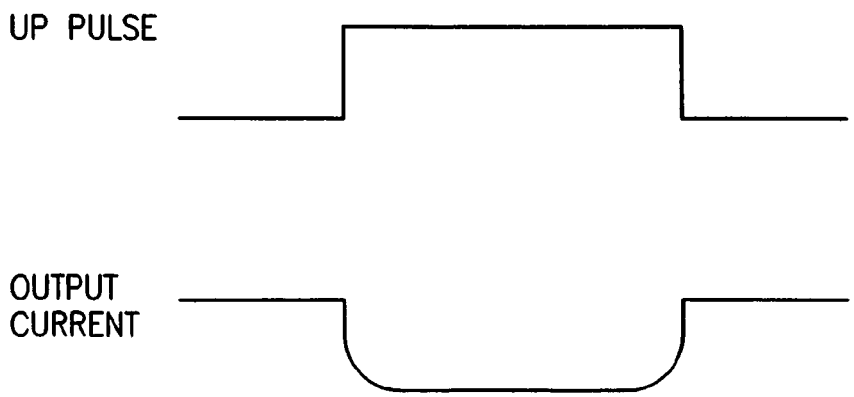
FIG. 7 illustrates the timing diagram of the charge pump of FIG. 4 in accordance with an exemplary embodiment of the invention.

FIG. 7 illustrates the output of the FIG. 4 circuit when an UP pulse is applied. As shown, the output current switches very quickly following the switching timing of the UP pulse. As also shown, there is no significant waveform distortion in the output signal which might produce a phase offset at the phase comparator 13 of a PLL or DLL.

Figure 1:
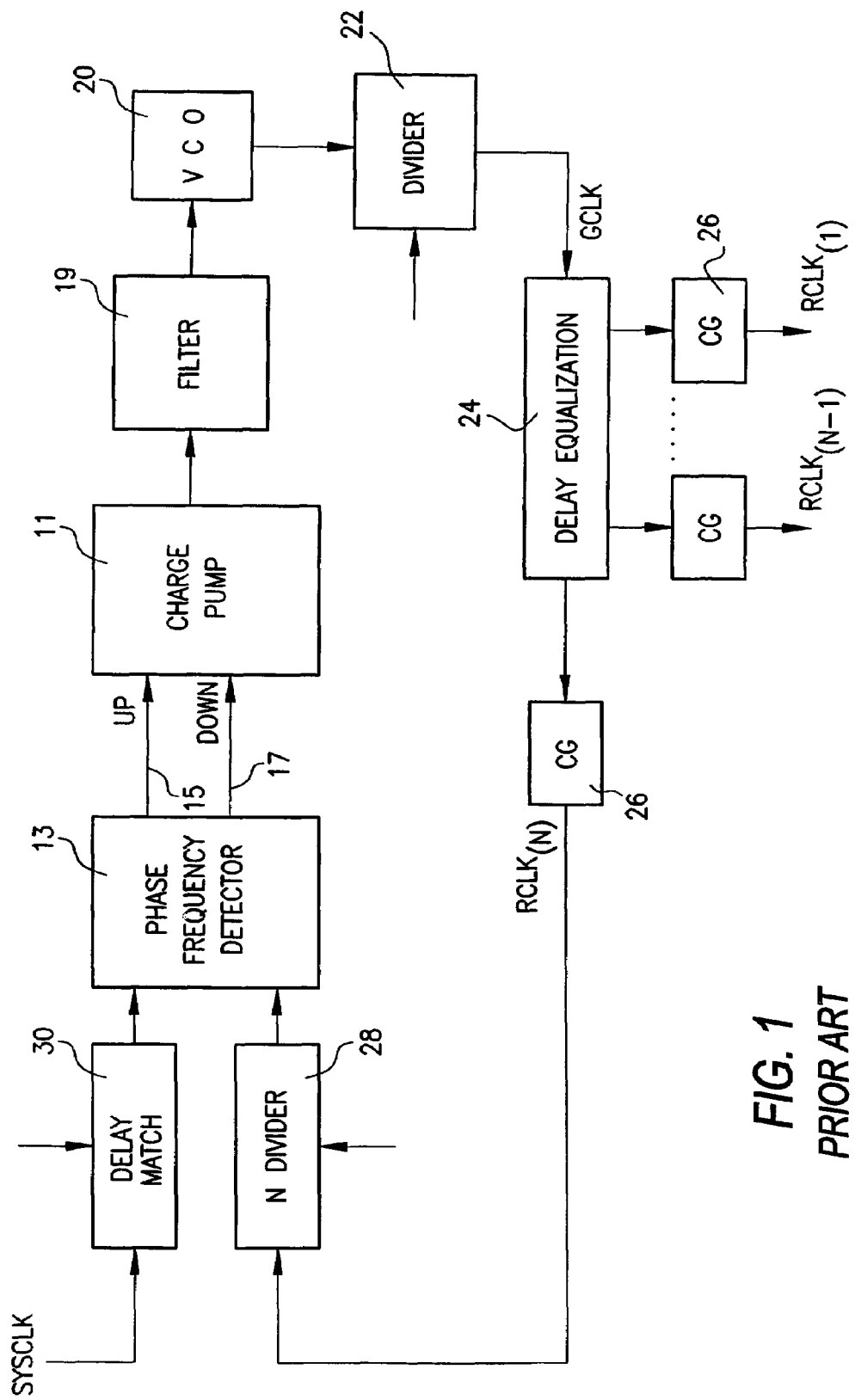
FIG. 1 illustrates a conventional phase lock loop (PLL) circuit which employs a charge pump 11.
Figure 2:
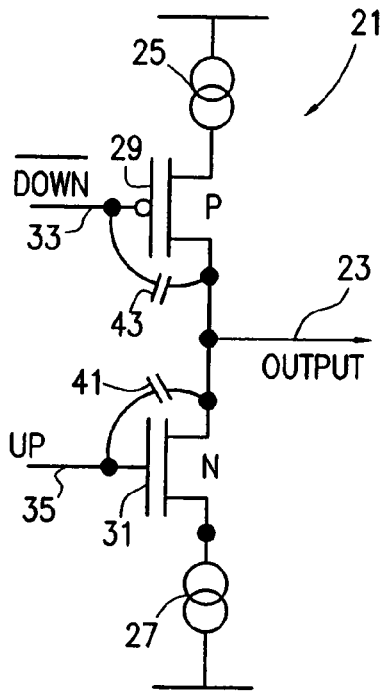
FIG. 2 illustrates a charge pump circuit which may be used in the PLL of FIG. 1.

The charge pump 61 of the invention can be used in the FIG. 1 phase lock loop circuit, as well as in delay lock loop (DLL) circuits to achieve fast turn on and turn off in response to short duration pump UP and pump DOWN input signals which may be generated in the PLL or DLL to keep it operating, even when phase lock is achieved.

Figure 8:
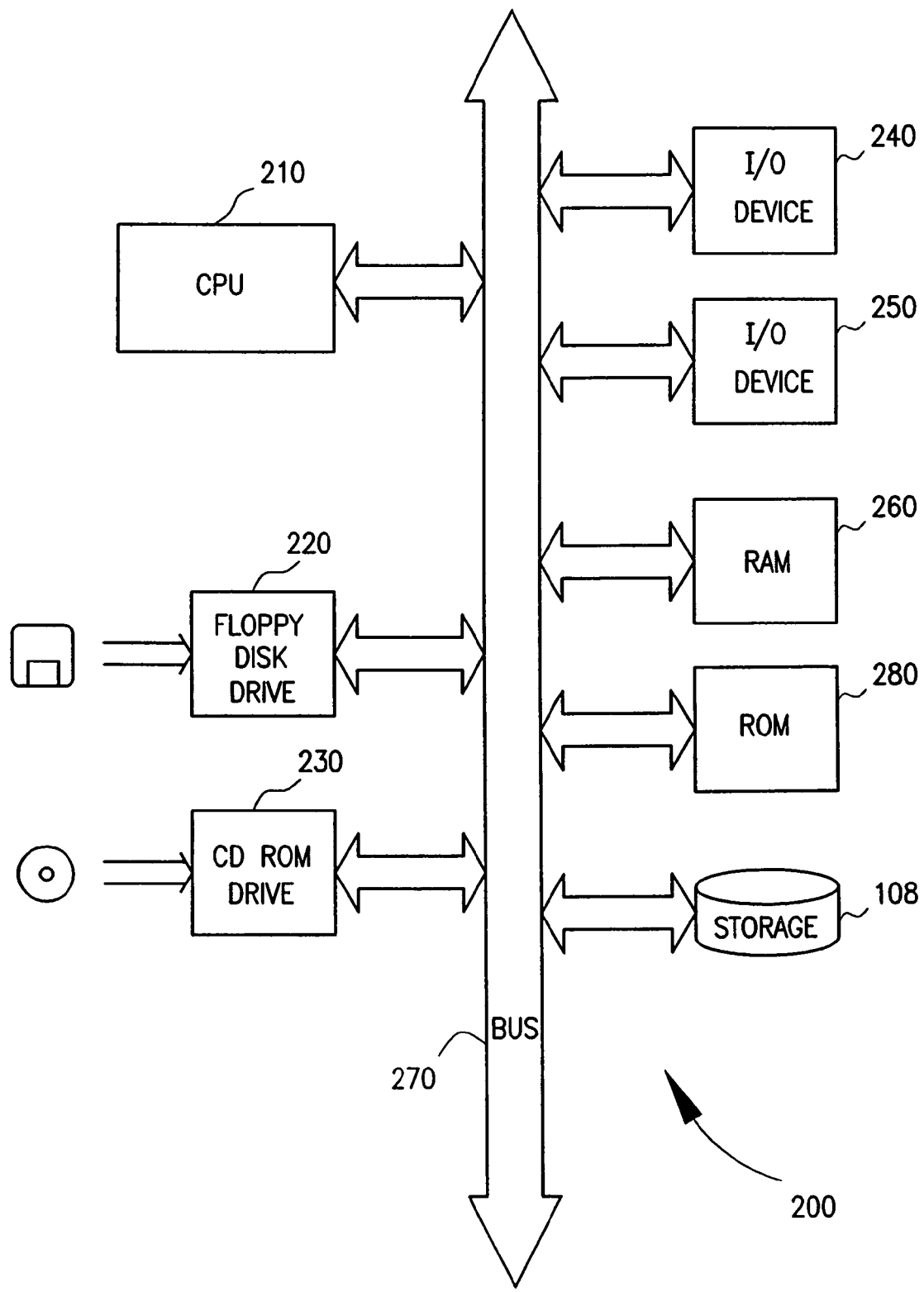
FIG. 8 illustrates a processor system which may employ the charge pump of the invention.

The charge pump 61 may also be used in any situation where fast switching of logic signals is needed, including in high speed processor systems. As shown in FIG. 8, a processor system, such as a computer system, for example, generally comprises a central processing unit (CPU) 210, for example, a microprocessor, that communicates with one or more input/output (I/O) devices 240, 250 over a bus 270. The computer system 200 also includes random access memory (RAM) 260, a read only memory (ROM) 280 and may also include peripheral devices such as a floppy disk drive 220 and a compact disk (CD) ROM drive 230 which also communicate with CPU 210 over the bus 270. Any one or more of the elements depicted in FIG. 8 may use the charge pump 61 of the invention and/or a PLL or DLL which employs the inventive charge pump 61.

While an exemplary embodiment of the invention has been described and illustrated, it should be apparent that many modifications and substitutions can be made without departing from the spirit and scope of the invention. Accordingly, the invention is not limited by the foregoing description, but is only limited by the scope of the appended claims.

What is claimed as new and desired to be protected by Letters Patent of the United States is:

1. A circuit comprising:

a first circuit portion comprising transistors of a first conductivity type;

a second circuit portion comprising transistors of a second conductivity type, said first and second circuit portions being interconnected by an output, said first circuit portion driving said output in response to a first pulse signal and a first DC bias signal, said second circuit portion driving the output in response to a second pulse signal and a second DC bias signal;

a first two-terminal discrete capacitor for controlling a start time and stop time for driving said output by said first circuit portion, said first capacitor having a first terminal for receiving a complementary signal of said first pulse signal and a second terminal interconnected to said first circuit portion; and a second two-terminal discrete capacitor for controlling a start time and stop time for driving said output by said second circuit portion, said second capacitor having a first terminal for receiving a complementary signal of said second pulse signal and a second terminal interconnected to said second circuit portion.

2. A circuit comprising:

a p-channel switching transistor, said p-channel switching transistor having a gate for receiving a first switching signal;

a p-channel bias transistor connected in series to said p-channel switching transistor, said connection of said p-channel bias transistor to said p-channel switching transistor defining a first node, said p-channel bias transistor having a gate for receiving a bias voltage, said serially connected p-channel switching transistor and p-channel bias transistor selectively connecting a first potential source and an output terminal;

an n-channel switching transistor, said n-channel switching transistor having a gate for receiving a second switching signal;

an n-channel bias transistor connected in series to said n-channel switching transistor, said connection of said n-channel bias transistor to said n-channel switching transistor defining a second node, said n-channel bias transistor having a gate for receiving a bias voltage, said serially connected n-channel switching transistor and n-channel bias transistor selectively connecting said output terminal and a second potential source;

a first two-terminal discrete capacitor for controlling a start time of said selective connection between said first potential source and said output terminal, said first capacitor having one terminal connected to said first node and another terminal connected to receive a complementary version of said first switching signal; and a second two-terminal discrete capacitor for controlling a start time of said selective connection between said second potential source and said output terminal, said second capacitor having one terminal connected to said second node and another terminal connected to receive a complementary version of said second switching signal.

3. A lock loop circuit comprising:

a voltage controlled oscillator;

a circuit for deriving a first clock signal from said voltage controlled oscillator;

a phase detector for receiving said first clock signal and a second clock signal, said phase detector producing first and second switching signals in accordance with a phase difference between said first and second clock signals;

a charge pump circuit for receiving said first and second switching signals and producing an output signal therefrom; and a filter circuit receiving the output signal from said charge pump and providing a filtered signal to control said voltage control oscillator, said charge pump circuit comprising:

a first plurality of serially connected transistors of a first conductivity type;

a second plurality of serially connected transistors of a second conductivity type, said first plurality of serially connected transistors being serially connected to the second plurality of serially connected transistors, the interconnection of said first and second plurality of transistors providing an output, a gate of one of said first plurality of transistors being configured to receive a first switching signal, a gate of another one of said first plurality of transistors being configured to receive a DC bias signal, a gate of one of said second plurality of transistors being configured to receive a second switching signal, and a gate of the other of said second plurality of transistors being configured to receive another DC bias signal;

a first node at the interconnection of transistors of said first plurality of transistors;

a second node at the interconnection of transistors of said second plurality of transistors;

a first two-terminal discrete capacitor for turning on and off said one of said first plurality of transistors, said first capacitor coupling a complementary signal of said first switching signal to said first node; and a second two-terminal discrete capacitor for turning on and off said one of said first plurality of transistors, said second capacitor coupling a complementary signal of said second switching signal to said second node.

4. A phase lock loop circuit as in claim 3 wherein said first plurality of transistors are p-channel transistors and said second plurality of transistors are n-channel transistors.

5. A phase lock loop as in claim 3 wherein said first plurality of transistors is a pair of transistors and said second plurality of transistors is a pair of transistors.

6. A lock loop circuit comprising:

a voltage controlled oscillator;

a circuit for deriving a first clock signal from said voltage controlled oscillator;

a phase detector for receiving said first clock signal and a second clock signal, said phase detector producing first and second switching signals in accordance with a phase difference between said first and second clock signals;

a charge pump circuit for receiving said first and second switching signals and producing an output signal therefrom;

a filter circuit receiving the output signal from said charge pump and providing a filtered signal to control said voltage control oscillator, said charge pump circuit comprising:

a first circuit portion comprising transistors of a first conductivity type and a second circuit portion comprising transistors of a second conductivity type, said first and second circuit portions being interconnected by an output, said first circuit portion being responsive to said first switching signal and its complement and a first DC bias signal, said second circuit portion being responsive to said second switching signal and its complement and a second DC bias signal;

a first non-parasitic non-MOS transistor-based capacitor for controlling at least one of said transistors of said first conductivity type, said first capacitor having a first terminal for receiving said complement of said first switching signal and a second terminal interconnected to said first circuit portion; and a second non-parasitic non-MOS transistor-based capacitor for controlling at least one of said transistors of said second conductivity type, said second capacitor having a first terminal for receiving said complement of said second switching signal and a second terminal interconnected to said second circuit portion.

7. A lock loop circuit comprising:

a voltage controlled oscillator;

a circuit for deriving a first clock signal from said voltage controlled oscillator;

a phase detector for receiving said first clock signal and a second clock signal, said phase detector producing first and second switching signals in accordance with a phase difference between said first and second clock signals;

a charge pump circuit for receiving said first and second switching signals and producing an output signal therefrom; and a filter circuit receiving the output signal from said charge pump and providing a filtered signal to control said voltage control oscillator;

said charge pump circuit comprising:

a p-channel switching transistor, said p-channel switching transistor having a gate for receiving said first switching signal;

a p-channel bias transistor connected in series with said p-channel switching transistor, said p-channel bias transistor having a gate for receiving a bias voltage, said serially connected p-channel switching transistor and p-channel bias transistor being connected between a first potential source and an output terminal;

an n-channel switching transistor, said n-channel switching transistor having a gate for receiving said second switching signal;

an n-channel bias transistor connected in series with said n-channel switching transistor, said n-channel bias transistor having a gate for receiving a bias voltage, said serially connected n-channel switching transistor and n-channel bias transistor being connected between said output terminal and a second potential source;

a first non-parasitic non-MOS transistor-based capacitor for changing a voltage potential across said p-channel bias transistor, said first capacitor coupling a complementary version of said first switching signal to a connection node of said p-channel transistors; and a second non-parasitic non-MOS transistor-based capacitor for changing a voltage potential across said n-channel bias transistor, said second capacitor coupling a complementary version of said second switching signal to a connection node of said n-channel transistors.

8. A processor system comprising:

a processor;

a data device coupled to said processor, at least one of said processor and data device including a charge pump circuit, said charge pump circuit comprising:

a first plurality of serially connected transistors of a first conductivity type;

a second plurality of serially connected transistors of a second conductivity type, said first plurality of serially connected transistors being serially connected to the second plurality of serially connected transistors, the interconnection of said first and second plurality of transistors providing an output, a gate of one of said first plurality of transistors being configured to receive a complement of a DOWN pulse signal, a gate of another one of said first plurality of transistors being configured to receive a DC bias signal, a gate of one of said second plurality of transistors being configured to receive an UP pulse signal, and a gate of the other of said second plurality of transistors being configured to receive another DC bias signal;

a first two-terminal discrete capacitor coupling said DOWN pulse signal to a first node at the interconnection of transistors of said first plurality of transistors and controlling a voltage potential of said first node when said gate of said one of said first plurality of transistors receives said complement of said DOWN pulse signal; and a second two-terminal discrete capacitor coupling a complement of said UP pulse signal to a second node at the interconnection of transistors of said second plurality of transistors and controlling a voltage potential of said second node when said gate of said one of said second plurality of transistors receives said UP pulse signal.

9. A processor system as in claim 8 wherein said first plurality of transistors is a pair of transistors and second plurality of transistors is a pair of transistors.

10. A circuit comprising:
a first plurality of serially connected transistors of a first conductivity type;
a second plurality of serially connected transistors of a second conductivity type, said first plurality of serially connected transistors being serially connected to the second plurality of serially connected transistors, the interconnection of said first and second plurality of transistors providing an output, a gate of one of said first plurality of transistors being configured to receive a complement of a DOWN pulse signal, a gate of another one of said first plurality of transistors being configured to receive a DC bias signal, a gate of one of said second plurality of transistors being configured to receive an UP pulse signal, and a gate of the other of said second plurality of transistors being configured to receive another DC bias signal;
a first non-parasitic non-MOS transistor-based capacitor for controlling said one of said first plurality of transistors having a gate configured to receive said complement of said DOWN pulse signal, said first capacitor coupling said DOWN pulse signal to a first node at the interconnection of transistors of said first plurality of transistors; and
a second non-parasitic non-MOS transistor-based capacitor for controlling said of said second plurality of transistors having a gate configured to receive said UP pulse signal, said second capacitor coupling a complement of said UP pulse signal to a second node at the interconnection of transistors of said second plurality of transistors, wherein said first plurality of transistors are p-channel transistors and said second plurality of transistors are n-channel transistors.

11. A processor system comprising:
a processor; and
a data device coupled to said processor, at least one of said processor and data device including a charge pump circuit, said charge pump circuit comprising:
a first circuit portion comprising transistors of a first conductivity type and a second circuit portion comprising transistors of a second conductivity type, said first and second circuit portions being interconnected by an output of said charge pump circuit, said first circuit portion being
responsive to a first pulse signal and a first dc bias signal, said second circuit portion being responsive to a second pulse signal and a second dc bias signal; and
a pair of two-terminal discrete capacitors for controlling a timing of said output of said charge pump circuit, said capacitors respectively coupling a complementary signal of said first pulse signal to said first circuit portion and a complementary signal of said second pulse signal to said second circuit portion.

12. A processor system comprising:
a processor; and
a data device coupled to said processor, at least one of said processor and data device including a charge pump circuit,
said charge pump circuit comprising:
a p-channel switching transistor, said p-channel switching transistor having a gate for receiving a first switching signal;
a p-channel bias transistor connected in series with said p-channel switching transistor, said p-channel bias transistor having a gate for receiving a bias voltage, said serially connected p-channel switching transistor and p-channel bias transistor being connected between a first potential source and an output terminal;
an n-channel switching transistor, said n-channel switching transistor having a gate for receiving a second switching signal;
an n-channel bias transistor connected in series with said n-channel switching transistor, said n-channel bias transistor having a gate for receiving a bias voltage, said serially connected n-channel switching transistor and n-channel bias transistor being connected between said output terminal and a second potential source;
a first non-parasitic non-MOS transistor-based capacitor for controlling said p-channel switching transistor, said first capacitor coupling a complementary version of said first switching signal to a connection node of said p-channel transistors; and
a second non-parasitic non-MOS transistor-based capacitor for controlling said n-channel switching transistor, said second capacitor coupling a complementary version of said second switching signal to a connection node of said n-channel transistors.

\* \* \* \* \*